(12) United States Patent
Berthoud et al.

(10) Patent No.: US 12,731,954 B2
(45) Date of Patent: Sep. 8, 2026

(54) METHOD AND APPARATUS FOR COMPENSATING A REFERENCE FREQUENCY SHIFT

(71) Applicant: ADVA Optical Networking SE, Meiningen OT Dreissigacker (DE)

(72) Inventors: Patrick Berthoud, Preles (CH); Manuel Haldimann, La Sagne (CH); Vladimir Dolgovskiy, Marin-Epagnier (CH)

(73) Assignee: ADTRAN NETWORKS SE, Meiningen-Dreissigacker (DE)

( * ) Notice: Subject to any disclaimer, the term of this patent is extended or adjusted under 35 U.S.C. 154(b) by 824 days.

(21) Appl. No.: 18/097,963

(22) Filed: Jan. 17, 2023

(65) Prior Publication Data

US 2024/0243543 A1 Jul. 18, 2024

(51) Int. Cl.
*H01S 3/13* (2006.01)
*G04F 5/14* (2006.01)
*H03L 7/26* (2006.01)

(52) U.S. Cl.
CPC .......... *H01S 3/1305* (2013.01); *H01S 3/1303* (2013.01); *H03L 7/26* (2013.01)

(58) Field of Classification Search
CPC ....... H01S 3/1305; H01S 3/1303; H03L 7/26; G04F 5/14
See application file for complete search history.

(56) References Cited

U.S. PATENT DOCUMENTS 5,146,185 A * 9/1992 Lewis ........................ H03L 7/26 372/2
5,148,437 A 9/1992 Ohtsu
2009/0256638 A1* 10/2009 Rosenbluh ................ H03L 7/26 331/3
2010/0156547 A1* 6/2010 McGuyer ................ G04F 5/145 331/94.1
2013/0056458 A1* 3/2013 Yun ........................... H03L 7/26 219/680

OTHER PUBLICATIONS

Yudin et al., "General Methods for Suppressing the Light Shift In Atomic Clocks Using Power Modulation", Phys. Rev. Appl. 14, 024001 (Aug. 3, 2020).

(Continued)

*Primary Examiner* — Xinning(Tom) Niu
(74) *Attorney, Agent, or Firm* — Jenkins, Taylor & Hunt, P.A.

(57) ABSTRACT

A method for compensating a reference frequency shift due to an interaction of resonant light provided by a resonant light source with atoms of an atomic beam crossing a resonant microwave cavity between light interaction zones includes toggling a wavelength of the provided resonant light between a main optical pumping transition, OPT1, and an alternate optical pumping transition, OPT2, of the atoms of the atomic beam while a frequency of the microwave probe signal fed into the microwave cavity is modulated with a frequency modulation depth, FMD. The method further includes computing a wavelength modulation compensation error signal, WM-CES depending on the measured signal amplitudes of Ramsey fringes used to control the frequency of the microwave probe signal fed into the microwave cavity.

17 Claims, 7 Drawing Sheets

(56) References Cited

OTHER PUBLICATIONS

Xu Shaohang et al, "Optimization of frequency shifts in optically detected magnetic-state-selection cesium beam atomic clocks", Europhysics Letters: A Letters Journal Exploring the Frontiers of Physics, Institute of Physics Publishing, Bristol, FR, vol. 136, No. 2, Feb. 4, 2022.
Extended European Search Report for Europen Patent Application Serial No. 24152251.1 (May 31, 2024).

* cited by examiner

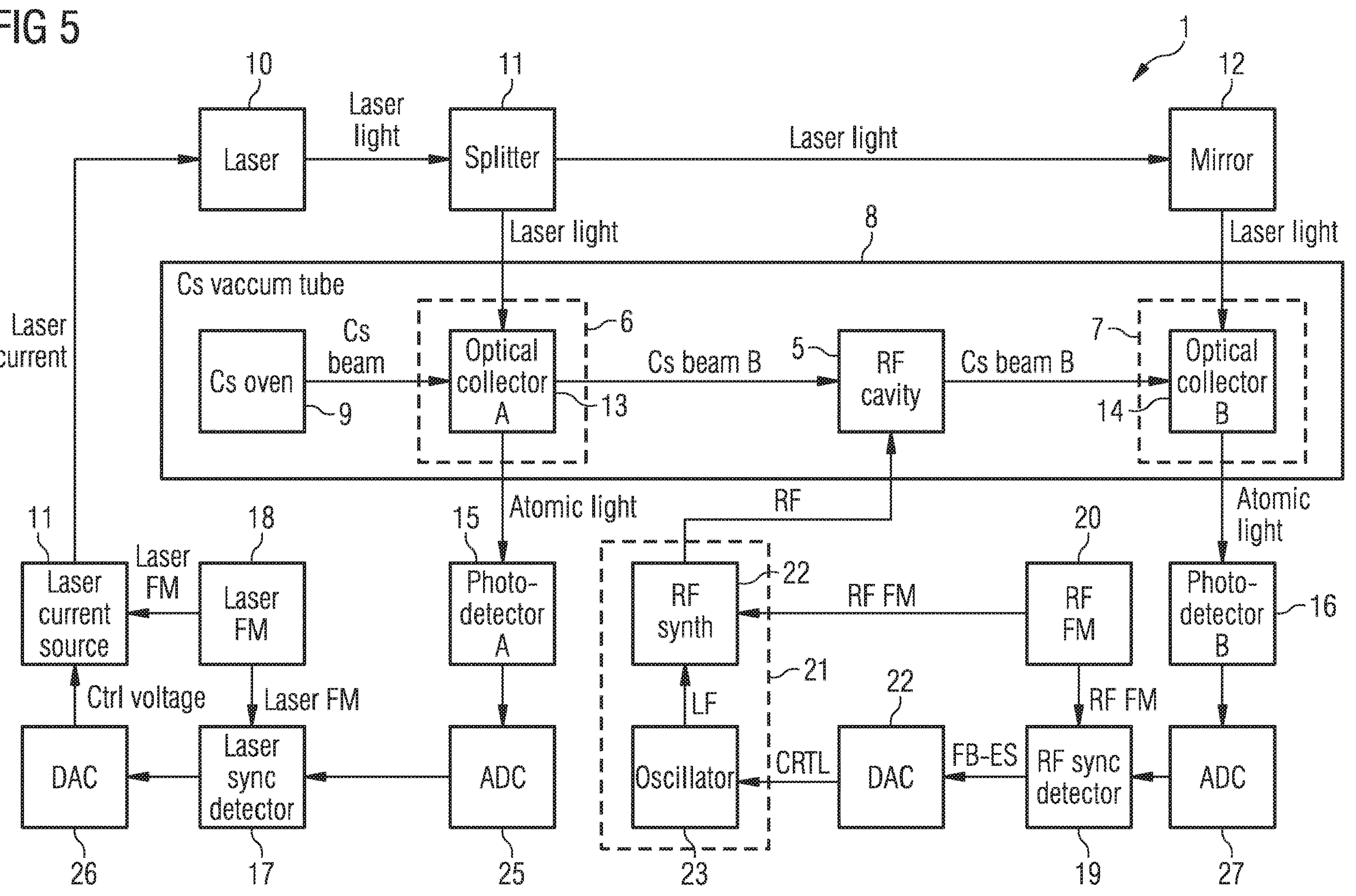
FIG 5
1
10
Laser
Laser light
11
Splitter
Laser light
12
Mirror
Laser light
Laser light
8
Cs vaccum tube
Laser current
Cs oven
9
Cs beam
Optical collector A
6
13
Cs beam B
5
RF cavity
Cs beam B
7
Optical collector B
14
Atomic light
Atomic light
RF
11
Laser current source
Laser FM
18
Laser FM
15
Photo-detector A
RF synth
22
RF FM
20
RF FM
Photo-detector B
16
21
Ctrl voltage
Laser FM
22
LF
RF FM
DAC
Laser sync detector
ADC
Oscillator
CRTL
DAC
FB-ES
RF sync detector
ADC
26
17
25
23
19
27

METHOD AND APPARATUS FOR COMPENSATING A REFERENCE FREQUENCY SHIFT

TECHNICAL FIELD

The invention relates to a method and apparatus for compensating a reference frequency shift due to an interaction of resonant light provided by a light source with atoms of an atomic beam crossing a resonant microwave cavity.

TECHNICAL BACKGROUND

Optical spectroscopy measurement can use broadband light sources such as lamps or more recently narrowband laser sources as probe means. The light sources generate light that is shined onto particles under test, in particular atoms or molecules, wherein the particle's signature is revealed either by light absorption or by fluorescence light emission. Optical spectroscopy measurement can be used for instance for gas detection or sensor operations. Among these latter group applications, atomic clocks can integrate laser sources either to prepare or to detect particles' energy levels to build frequency and timing reference sources.

An atomic clock is an oscillator whose frequency is matched to that of an atomic transition of a two-level atom. FIG. 1 is a schematic diagram illustrating the operation of a conventional atomic clock using magnetic deflection. Atoms provided by an oven form an atomic beam B crossing a resonant microwave cavity. The source of atoms is adapted to emit atoms in a continuous atomic beam B. Atomic preparation is achieved by magnetic deflection. The conventional apparatus illustrated in FIG. 1 uses a comparatively weak flux whose velocity selection and magnetic deflection is leading to a relative low performance.

To increase performance, atomic preparation by optical pumping has been proposed as illustrated schematically in FIG. 2. Atoms emitted by the oven forming the atom source in a continuous atomic beam B cross a collimated laser beam and undergo optical pumping. The atomic beam B is crossing a resonant microwave cavity where the atomic reference frequency is probed. The atomic beam B comprising atoms in one of two ground states propagates in high vacuum from the preparation zone through said resonant microwave cavity to a detection zone. The microwave cavity applies in response to a microwave signal an alternating magnetic field to the atoms of the atomic beam propagating through the microwave cavity to provide microwave energy which due to a resonance phenomenon changes the energy state of the atoms of the atomic beam propagating through the microwave cavity from one ground state to the other ground state. Atoms of the atomic beam B received from the microwave cavity propagate to the detection zone. At the detection zone, the atomic beam B crosses perpendicularly laser light provided by a laser light source to change an energy state of the atoms of the atomic beam from the ground energy state to an excited energy state by optical pumping. A detector provides a detection signal proportional to the quantity of the received atoms applied to an oscillator which tunes the frequency of the magnetic field in the microwave cavity depending on the detection signal.

The optical pumping process used in the apparatus illustrated in FIG. 2 has numerous advantages with respect to the setup illustrated in FIG. 1 such as efficiency bringing more particles from a given state to another state. Other advantages are tunability by accessing more quantum states with different wavelengths as well as a simplification of the hardware setup of the apparatus.

The optical pumping applied by the conventional apparatus as illustrated in FIG. 2 does, however, also have disadvantages. Optical pumping has drawbacks such as particles energy level change which is due to the coupling of the light electrical field with particle quantum states. This unwanted effect is also known as the AC Stark Shift or commonly named as light shift. The light shift happens with resonant light, not necessarily with laser light which on top of this is coherent (signal phase). Different approaches have been taken to overcome or to at least mitigate the unwanted light shift effect.

A conventional approach to overcome the light shift effect is performing optical power modulation of the light power (see Yudin et al., «General methods for suppressing the light shift in atomic clocks using power modulation", Phys. Rev. Appl. 14, 024001 (2020). However, this technique is not applicable to the proposed physical setup, because the used optical pumping process of the atomic beam reaches optical saturation, which is a prohibited condition of the power modulation technique.

Accordingly, there is a need to provide a method and apparatus which compensate the light shift effects and which provide high long-term stability.

SUMMARY OF THE INVENTION

The invention provides according to a first aspect of the present invention a method for compensating a reference frequency shift due to an interaction of resonant light provided by a light source with atoms of an atomic beam crossing a resonant microwave cavity between light interaction zones comprising the steps of:

- toggling a wavelength of the provided light between a main optical pumping transition and an alternate optical pumping transition of the atoms of the atomic beam while a frequency of the microwave probe signal fed into the microwave cavity is modulated with a frequency modulation depth, and
- computing a wavelength modulation compensation error signal, WM-CES, depending on the measured signal amplitudes of Ramsey fringes used to control the frequency of the microwave probe signal fed into the microwave cavity.

The wavelength modulation compensation error signal, WM-CES, may also be referred to as the wavelength modulation combined error signal.

In a possible embodiment of the method according to the first aspect of the present invention, the atomic beam is a cesium beam comprising cesium atoms emitted by a cesium oven.

In a further possible embodiment of the method according to the first aspect of the present invention, the emitted atomic beam propagates in high vacuum through a first light interaction zone where the atomic beam crosses perpendicularly laser light provided by the laser light source to change an energy state of the atoms of the atomic beam from a ground energy state to an excited energy state by optical pumping using available optical pumping transitions of the atoms providing different fluorescence yields.

The light source can be a laser light source providing resonant light.

In a further possible embodiment of the method according to the first aspect of the present invention, a laser frequency of the laser light provided by the laser light source is locked to the main optical pumping transition or is locked to the alternate optical pumping transition of the atoms while a microwave probe signal fed into the microwave cavity is swept to produce Ramsey fringes.

In a further possible embodiment of the method according to the first aspect of the present invention, the laser frequency of the laser light is toggled between the main optical pumping transition and the alternate optical pumping transition by controlling a laser injection current supplied to the laser light source.

In a further possible embodiment of the method according to the first aspect of the present invention, a first signal amplitude is measured at the negative frequency modulation depth on the main optical pumping transition,

- a second signal amplitude is measured at the positive frequency modulation depth on the main optical pumping transition,
- a third signal amplitude is measured at the negative frequency modulation depth on the alternate optical pumping transition and
- a fourth signal amplitude is measured at the positive frequency modulation depth on the alternate optical transition.

In a further possible embodiment of the method according to the first aspect of the present invention, the wavelength modulation compensation error signal (WM-CES) is calculated depending on the measured signal amplitudes of the produced Ramsey fringes according to the following equation:

$$WM\text{-}CES=(Z1-Z2)-\beta*(Z3-Z4),$$

wherein $\beta$ is an adjustable parameter and wherein

- Z1 is the first signal amplitude measured at the negative frequency modulation depth on the main optical pumping transition,
- Z2 is the second signal amplitude measured at the positive frequency modulation depth on the main optical pumping transition,
- Z3 is the third signal amplitude measured at the negative frequency modulation depth on the alternate optical pumping transition and
- Z4 is the fourth signal amplitude measured at the positive frequency modulation depth on the alternate optical pumping transition.

In a possible embodiment of the method according to the first aspect of the present invention, a feedback error signal is calculated by multiplying the wavelength modulation compensation error signal, WM-CES, with a loop filter constant.

In a further possible embodiment of the method according to the first aspect of the present invention, the feedback error signal is converted by a digital to analogue converter into a control voltage supplied to a tunable oscillator.

In a further possible embodiment of the method according to the first aspect of the present invention, the atomic beam comprising atoms of one of two ground states propagates in high vacuum from the first light interaction zone through the resonant microwave cavity to a second light interaction zone.

In a further possible embodiment of the method according to the first aspect of the present invention, the microwave cavity applies in response to a microwave signal an alternating magnetic field to the atoms of the atomic beam propagating through the microwave cavity to provide microwave energy which due to a resonance phenomenon changes the energy state of the atoms of the atomic beam propagating through the microwave cavity from one ground state to the other ground state.

In a further possible embodiment of the method according to the first aspect of the present invention, the atoms of the atomic beam received from the microwave cavity comprising the changed ground state propagate in high vacuum through a second light interaction zone where the atomic beam crosses perpendicularly laser light provided by the laser light source to change an energy state of the atoms of the atomic beam from the ground energy state to an excited energy state by optical pumping using available optical pumping transitions of the atoms providing different fluorescence yields.

In a further possible embodiment of the method according to the first aspect of the present invention, fluorescence light emitted by the atoms in the second light interaction zone are collected by a photodetector to generate a measurement signal having signal amplitudes of produced Ramsey fringes proportional to the quantity of the fluorescent light.

In a further possible embodiment of the method according to the first aspect of the present invention, the control voltage output by the digital to analogue converter is supplied to the tunable oscillator to tune a frequency of the microwave signal generating the alternating magnetic field within the microwave cavity.

The invention provides according to a second aspect an apparatus for compensating a reference frequency shift due to an interaction of resonant light provided by a light source with atoms of an atomic beam crossing a resonant microwave cavity between light interaction zones, said apparatus comprising:

- a modulation unit adapted to toggle a wavelength of the provided light between a main optical pumping transition and an alternate optical pumping transition of the atoms of the atomic beam while a frequency of the microwave probe signal fed into the microwave cavity is modulated with a frequency modulation depth,
- a measurement unit adapted to measure signal amplitudes of produced Ramsey fringes and
- a calculation unit adapted to compute a wavelength modulation compensation error signal depending on the measured signal amplitudes of the produced Ramsey fringes used to control the frequency of the microwave probe signal fed into the microwave cavity.

The invention further provides according to a third aspect an atomic clock device comprising an apparatus according to the second aspect of the present invention.

BRIEF DESCRIPTION OF FIGURES

In the following, possible embodiments of the different aspects of the present invention are described in more detail with reference to the enclosed figures.

FIG. 5 shows a block diagram for illustrating a possible exemplary embodiment of the apparatus shown in FIGS. 3, 4 according to an aspect of the present invention;

DETAILED DESCRIPTION OF EMBODIMENTS

Figure 1:
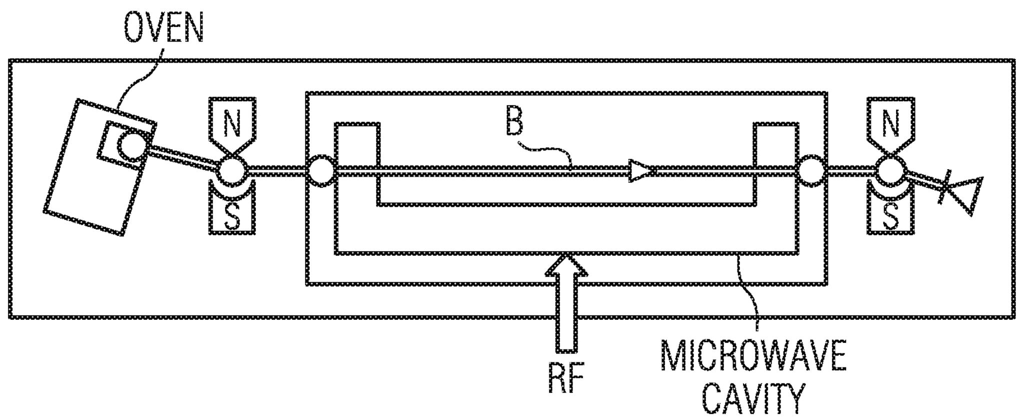
FIG. 1 illustrates schematically a conventional atomic clock using magnetic deflection.
Figure 2:
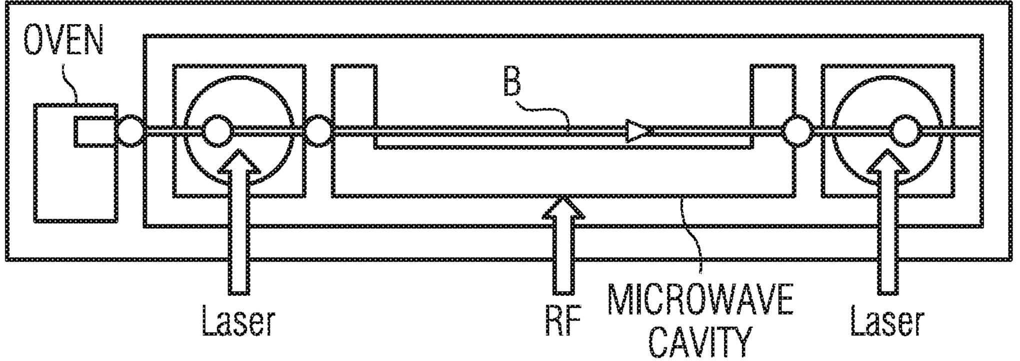
FIG. 2 illustrates schematically a conventional atomic clock using optical pumping.
Figure 3:
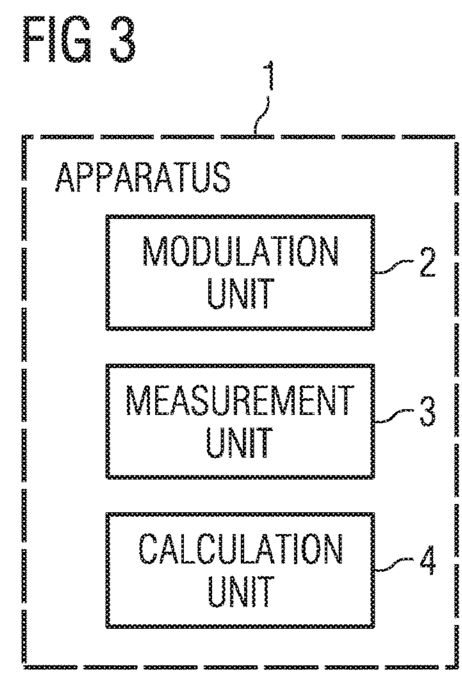
FIG. 3 shows a block diagram of a possible exemplary embodiment of an apparatus for compensating a reference frequency shift according to an aspect of the present invention.

FIG. 3 shows a schematic block diagram of a possible exemplary embodiment of an apparatus 1 for compensating a reference frequency shift according to an aspect of the present invention. FIG. 3 shows schematically the main components of the apparatus 1. The apparatus 1 is provided for compensating a reference frequency shift due to an interaction of resonant light provided by a light source with atoms of an atomic beam B crossing a resonant microwave cavity between light interaction zones. The light source is in a preferred embodiment a laser light source. In the illustrated embodiment of FIG. 3, the apparatus 1 comprises a modulation unit 2 adapted to toggle a wavelength of the provided laser light between a main optical pumping transition OPT1 and an alternate optical pumping transition OPT2 of the atoms of the atomic beam B while a frequency of the microwave probe signal fed into the microwave cavity of the apparatus 1 is modulated with a frequency modulation depth FMD. The apparatus 1 further comprises a measurement unit 3 adapted to measure signal amplitudes of produced Ramsey fringes. As illustrated in FIG. 3, the apparatus 1 further comprises a calculation unit 4 adapted to compute a wavelength modulation compensation error signal WM-CES depending on the measured signal amplitudes of the produced Ramsey fringes used to control the frequency of the microwave probe signal fed into the microwave cavity of the apparatus 1.

Figure 4:
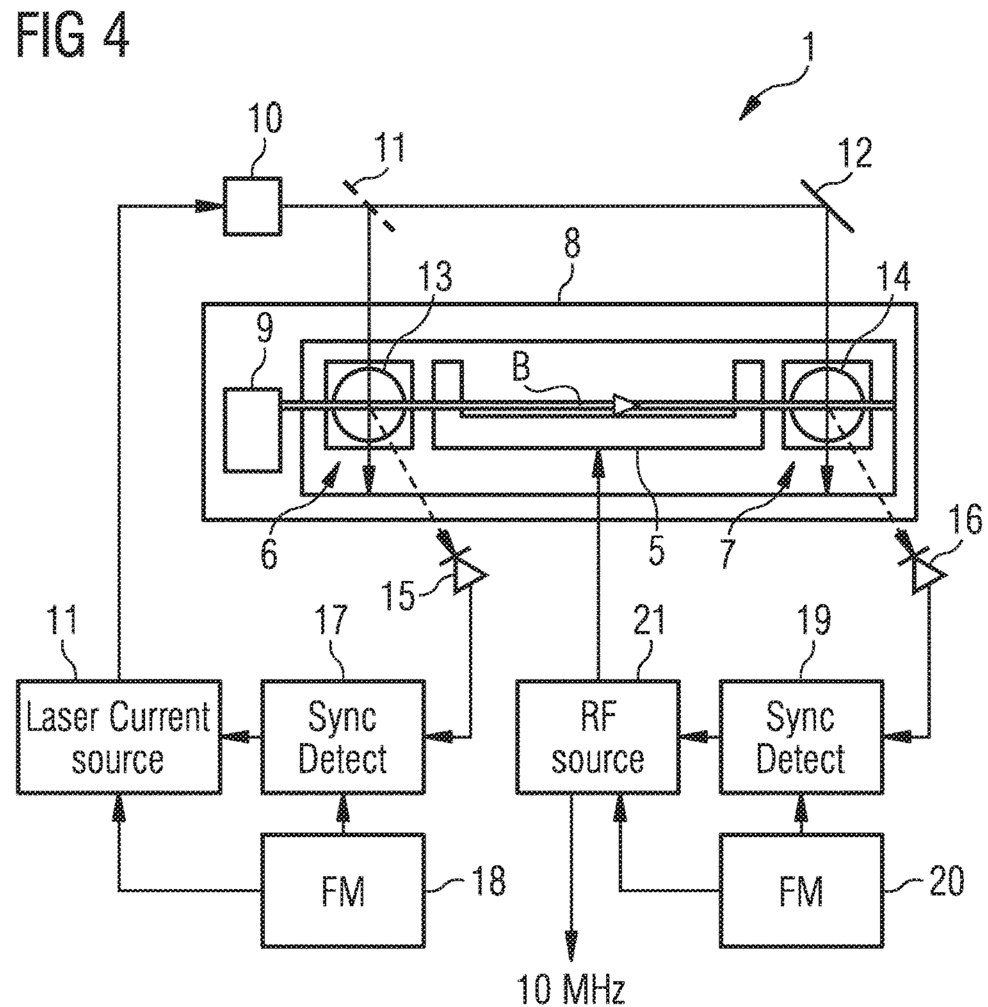
FIG. 4 shows a schematic diagram for illustrating a possible exemplary embodiment of the apparatus shown in FIG. 3.

FIGS. 4, 5 show a possible exemplary embodiment of an apparatus 1 according to the present invention in more detail. As can be seen in FIG. 4, the apparatus 1 comprises in the illustrated embodiment a resonant microwave cavity 5 provided between a first light interaction zone 6 and a second light interaction zone 7. Both light interaction zones 6, 7 and the microwave cavity 5 are placed in a high vacuum tube 8. The high vacuum tube 8 further comprises an oven 9 providing an atomic beam B. As illustrated in FIG. 4, the atomic beam B crosses the first light interaction zone 6, the resonant microwave cavity 5 and the second light interaction zone 7. The atomic beam B emitted by the oven 9 propagates in the high vacuum of the vacuum tube 8 through the first light interaction zone 6 where the atomic beam B crosses perpendicularly laser light provided by a light source 10 to change an energy state of the atoms of the generated atomic beam B from a ground energy state to an excited energy state by optical pumping using available optical pumping transitions OPT providing different fluorescence yields. The light source 10 must be resonant (at the atomic optical reference frequency) and usually fairly narrow to have a significant effect. In a preferred embodiment the light source 10 is a laser light source. It is also possible to use a lamp source (not coherent light) that leads to the same (maybe less efficient) light shift effect. The laser frequency of the laser light generated by the laser light source 10 can be toggled between a main optical pumping transition OPT1 and an alternate optical pumping transition OPT2 by controlling a laser injection current supplied to the laser light source 10. The laser injection current is generated by a laser current source 11 as illustrated in FIG. 4. The laser light emitted by the laser light source 10 is supplied to a splitter 12 splitting the received laser light in two parts. The first split laser beam is directed to the first light interaction zone 6 within the vacuum tube 8 as illustrated in FIG. 4. The second split laser light beam is directed to a mirror 12 directing the laser light to the second light interaction zone 7 as shown in FIG. 4.

The first light interaction zone 6 comprises a first optical collector 13. The second light interaction zone 7 comprises a second optical collector 14. The microwave cavity 5 is located between the optical collectors 13, 14. For each light interaction zone 6, 7, an associated photodetector 15, 16 can be provided as shown in FIG. 4. The first photodetector 15 of the first light interaction zone 6 receives atomic light from the first optical collector 13 and is connected via an analogue digital converter 25 to a laser sync detector 17 receiving a laser FM signal from a laser frequency modulator 18 as shown in FIG. 4. The laser sync detector 17 is connected via a digital to analogue converter 26 to the laser current source 11 to supply a control voltage CRTL. In response to the supplied control voltage CRTL, a laser injection current is generated by the laser current source 11 supplied to the laser light source 10 shown in FIG. 4.

The second photodetector 16 at the second light interaction zone 7 receives atomic light from the second optical collector 14 and is connected via an analog to digital converter 27 to an RF sync detector 19 receiving an RF FM signal from a frequency modulator 20 as shown in FIG. 4. The RF sync detector 19 supplies a control voltage CRTL to a tunable oscillator 23 of an RF signal source 21 feeding a microwave probe signal into the microwave cavity 5 and generating an output clock signal with a frequency of e.g. 10 MHz. The microwave probe signal fed into the microwave cavity 5 is modulated with a frequency modulation depth FMD. The microwave cavity 5 illustrated in FIG. 4 comprises a Ramsey cavity.

As can be seen in FIGS. 4,5 the apparatus 1 comprises two control loops, i.e. a first loop including a first light interaction zone 6 and its optical collector 13 providing atomic light detected by the first photodetector 15 and a second control loop comprising the second light interaction zone 7 and its optical collector 14 providing atomic light measured by the second photodetector 16. The first control loop can control the wavelength of the provided laser light whereas the second control loop controls the frequency of the microwave probe signal fed into the microwave cavity 5. Between the first light interaction zone 6 and the second light interaction zone 7, there is a path being sensitive for light shift. With the method and apparatus 1 according to the present invention, a wavelength modulation of the laser light provided by the laser light source 10 is performed to compensate a light shift perturbating the continuous atomic beam B in particular along the path throughout the microwave cavity 5. By using appropriate atomic transitions, a significant error signal is calculated and used to compensate for the light shift perturbating the continuous atomic beam B. The compensation provides for improved long-term stability, accuracy and thermal sensitivity of the optically pumped atomic beam clock. In a possible embodiment, the oven 9 comprises a cesium oven. The atomic beam B can be a cesium beam comprising cesium atoms emitted by the cesium oven 9.

The wavelength of the laser light provided by the laser light source 10 is toggled between a main optical pumping transition OPT1 and an alternate optical pumping transition OPT2 of the atoms of the atomic beam B while the frequency of the microwave probe signal fed into the microwave cavity 5 is modulated with a predefined frequency modulation depth FMD. A wavelength modulation compensation error signal WM-CES is computed in real time depending on the measured signal amplitudes Z of Ramsey fringes used to control the frequency of the microwave probe signal fed into the microwave cavity 5.

In a possible embodiment, a laser frequency of the laser light provided by the laser light source 10 can be locked to the main optical pumping transition OPT1 or can be locked to the alternate optical pumping transition OPT1 of the atoms while the microwave probe signal fed into the microwave cavity 5 is swept to produce Ramsey fringes. A Ramsey fringe is a spectral feature generated when a quantum mechanical transition is excited by two identical frequency, time-separated electromagnetic pulses. The Ramsey fringes can be produced when two pulses, time-delayed with respect to one another and each consisting of a pair of travelling waves, interact with an ensemble of atoms. The laser frequency of the laser light generated by the laser light source 10 is toggled between the main optical pumping transition OPT1 and the alternate optical pumping transition OPT2 by controlling the laser injection current supplied by the laser current source 11 to the laser light source 10.

FIG. 5 illustrates a possible exemplary embodiment of an apparatus 1 for compensating a reference frequency shift due to an interaction of laser light with atoms of an atomic beam B in more detail. The illustrated embodiment of FIG. 5 comprises an apparatus 1 using cesium atoms Cs generated by a cesium atom oven 9 within a vacuum tube 8. The vacuum tube 8 comprises the optical collector 13 of the first light interaction zone 6, the microwave cavity 5 and the optical collector 14 of the second light interaction zone 7. The laser light generated by the laser light source 10 is split and supplied to both laser light interaction zones 6, 7. The first photodetector 15 is provided at the first light interaction zone 6 and the second photodetector 16 is provided at the second light interaction zone 7 as shown in FIG. 5. The laser light provided to prepare and detect the atomic beam β is coming from a laser module adapted to emit laser light at the Cs atomic wavelength (852 nm). The laser light beam can be directed inside the vacuum tube 8 through viewports. Fluorescent lights emitted by the cesium atoms in both light interaction zones 6, 7 are collected and sent out of the tube 8 also through viewports. Tiny fluorescent light powers can be used to control the laser optical frequency or wavelength and clock probing signals, in particular the RF frequency, the RF power and the DC magnetic field.

Regarding a total light shift of the cesium beam atoms travelling in the Ramsey cavity 5, i.e. the sensitive path, there are different possible contributions from both light interaction zones 6, 7. There is laser light scattering on physical surfaces. A contribution of laser light scattering is proportional to the laser output power. Its dynamic contribution can be minimized by regulating the laser power.

A second contribution comprises an atomic beam fluorescence light. The contribution of atomic beam fluorescence light hardly depends on the laser power as the optical pumping process is almost saturated. The atomic beam fluorescence light contribution is also hardly dependent on the atomic beam flux because the cesium oven 9 can be thermally regulated.

A third contribution comprises atomic vapor fluorescence light. As for the atomic beam contribution, it hardly depends on the laser power, because the optical pumping process is almost saturated. However, atomic vapor fluorescence light contribution depends largely on the external temperature and on time because the residual atomic vapor is not stabilized (no temperature regulation of the complete Cs vacuum tube).

As the atomic beam B has a given axial velocity and propagates from left to right in the illustrated schematic diagrams, the light shift contributions from the light interaction zones 6, 7 must be considered with opposite signs, because of the Doppler effect. Regarding the dynamic parts which is the main concern to achieve a long-term stability of the apparatus 1, only the two atomic vapor fluorescence light contributions matters. Because the residual atomic vapor pressure is much larger in the first light interaction zone 6 as compared to the second light interaction zone 7 (by a factor of around 100), only the atomic vapor from the first light interaction zone 6 has an impact.

Figure 6:
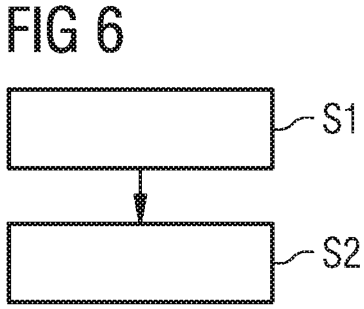
FIG. 6 shows a flowchart illustrating a possible exemplary embodiment of a method for compensating a reference frequency shift according to an aspect of the present invention.

FIG. 6 shows a flowchart of a possible exemplary embodiment of a method for compensating a reference frequency shift due to an interaction of resonant light provided by a light source 10, in particular by a laser light source, with atoms of an atomic beam B crossing a resonant microwave cavity 5 between two light interaction zones 6, 7.

In the illustrated embodiment, the method comprises two main steps.

In a first step S1, a wavelength of the provided light is toggled by the modulation unit 2 between a main optical pumping transition OPT1 and an alternate optical pumping transition OPT2 of the atoms of the atomic beam B while the frequency of the microwave probe signal fed into the microwave cavity 5 is modulated with a frequency modulation depth FMD.

In a further step S2, a wavelength modulation compensation error signal WM-CES is computed by the calculation unit 4 depending on the measured signal amplitudes of Ramsey fringes used to control the frequency of the microwave probe signal fed into the microwave cavity 5 provided within the tube 8 of the apparatus 1 as illustrated in FIGS. 4, 5. The signal amplitudes of the Ramsey fringes are measured by a photodetector 16 of the measurement unit 3 located at the second light interaction zone 4. The atomic beam B can be a cesium beam comprising cesium atoms emitted by the cesium oven 9 shown in FIG. 5. The atomic beam B emitted by the oven 9 propagates in the high vacuum of the tube 8 through the first light interaction zone 6 where the atomic beam B crosses perpendicularly the laser light provided by the laser light source 10 to change an energy state of the atoms of the atomic beam B from a ground energy state to an excited energy state by optical pumping using available optical pumping transitions OPT of the atoms providing different fluorescence yields. The laser frequency of the laser light provided by the laser light source 10 is locked in the modulation unit 2 either to the main optical pumping transition OPT1 or to the alternate optical pumping transition OPT2 of the atoms while the microwave probe signal fed into the microwave cavity 5 is swept to produce Ramsey fringes. The laser frequency of the laser light generated by the laser light source 10 is toggled in step S1 between the main optical pumping transition OPT1 and the alternate optical pumping transition OPT2 by controlling the laser injection current supplied by the laser current source 11 to the laser light source 10.

On the basis of the atomic light generated in the second light interaction zone 7, a first signal amplitude Z1 can be measured by the photodetector 16 of the measurement unit 2 at the negative frequency modulation depth (−FMD) on the main optical pumping transition OPT1. Further, a second signal amplitude Z2 is measured by the photodetector 16 of the measurement unit 2 at the positive frequency modulation depth (+FMD) on the main optical pumping transition OPT1.

Further, a third signal amplitude Z3 is measured by the photodetector 16 of the measurement unit 2 at the negative frequency modulation depth (−FMD) on the alternate optical pumping transition OPT2. Further, a fourth signal amplitude Z4 is measured by the photodetector 16 of the measurement unit 2 at the positive frequency modulation depth (+FMD) on the alternate optical pumping transition OPT2.

In step S2 of the method illustrated in FIG. 6, a wavelength modulation compensation error signal WMC-ES is calculated by the calculation unit 4 in real time depending on the measured signal amplitudes Z1, Z2, Z3, Z4 of the produced Ramsey fringes according to the following equation:

$$WM\text{-}CES=(Z1-Z2)-\beta*(Z3-Z4),$$

wherein β is an adjustable parameter and wherein Z1 to Z4 are the first to fourth signal amplitude measured at the negative and positive frequency modulation depth FMD at the main and alternate optical pumping transition OPT1, OPT2.

As illustrated in the block diagram of FIG. 5, the measured signal amplitudes Z1 to Z4 can be supplied to the RF sync detector 19 by the photodetector 16 via the ADC 27 wherein a processor or FPGA of the calculation unit 4 integrated in the RF sync detector 19 can perform the calculation of the wavelength modulation compensation error signal WM-CES. The calculated wavelength modulation compensation error signal WM-CES can be multiplied by the processor with a loop filter constant kPID to provide a feedback error signal FB-ES. This feedback error signal FB-ES is converted by the digital to analogue converter 22 shown in the block diagram of FIG. into a control voltage CRTL supplied to a tunable oscillator 23 within the radio frequency source 21. The tunable oscillator 23 supplies a signal to the RF synthesizer 24 of the RF signal source 21.

The microwave cavity 5 receiving the RF signal from the RF signal source 21 supplies in response to the received signal an alternating magnetic field to the atoms of the atomic beam B propagating through the microwave cavity 5 to provide microwave energy which due a resonance phenomenon changes the energy state of the atoms of the atomic beam B propagating through the microwave cavity 5 from one ground state to the other ground state. The frequency of the microwave probe signal supplied by the RF signal source 21 is controlled depending on the computed wavelength modulation compensation error signal WMC-ES. This wavelength modulation compensation error signal WM-CES is computed by a processor or FPGA of the calculation unit 4 in step S2 depending on the measured signal amplitudes Z of the Ramsey fringes. Fluorescent light emitted by the atoms in the second light interaction zone 7 are collected by the photodetector 16 of the measurement unit 3 to generate the signal amplitudes Zi of the produced Ramsey fringes being proportional to the quantity of the fluorescent light.

Figure 7:
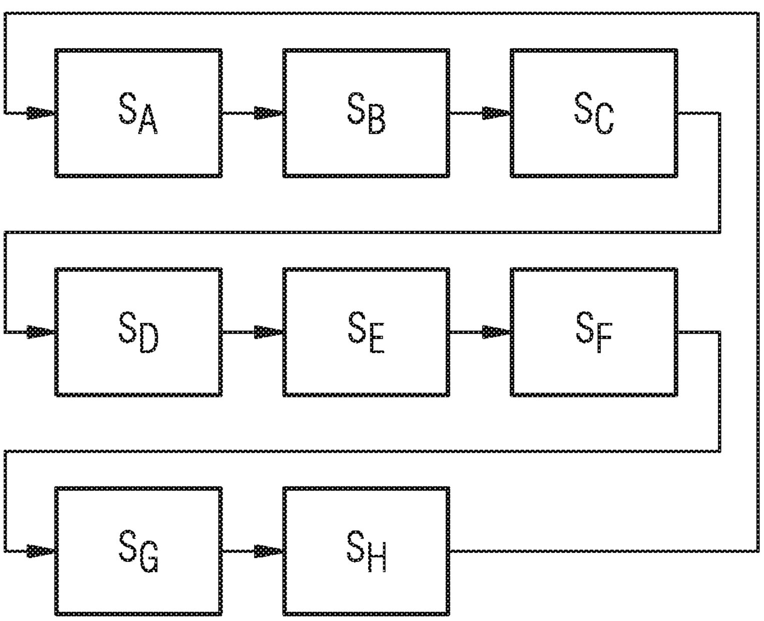
FIG. 7 shows a further flowchart for illustrating a possible exemplary embodiment of the method according to the present invention.

FIG. 7 illustrates a possible exemplary implementation of an algorithm to perform a method for compensating a reference frequency shift according to the present invention.

In a first step $S_A$, a laser frequency of the laser light provided by the laser light source 10 is locked by the modulation unit 2 to the main optical pumping transition OPT1.

Subsequently, the first signal amplitude Z1 is measured in step SB at the negative frequency modulation depth (−FMD) on the main optical pumping transition OPT1.

In a further step $S_C$, the second signal amplitude Z2 is measured at the positive frequency modulation depth (+FMD) on the main optical pumping transition OPT1.

In a further step $S_D$, the laser frequency of the laser light provided by the laser light source 10 is locked by the modulation unit 2 to an alternate optical pumping transition OPT2.

In a subsequent step SE, the third signal amplitude Z3 is measured at the negative frequency modulation depth (−FMD) on the alternate optical pumping transition OPT2.

In the next step SF, the fourth signal amplitude Z4 is measured at the positive frequency modulation depth (+FMD) on the alternate optical pumping transition OPT2 as shown in FIG. 7.

The first to fourth signal amplitude Z1 to Z4 can be stored temporarily to calculate a wavelength modulation compensation error signal WM-CES by a processor of the calculation unit 4 of the apparatus 1. The processor is integrated in the RF sync detector 19 shown in FIG. 5.

In a step $S_G$, the wavelength modulation compensation error signal WM-CES is calculated by the processor of the calculation unit 4 depending on the signal amplitudes Z1, Z2, Z3, Z4 of the produced and measured Ramsey fringes according to the following equation:

$$WM\text{-}CES=(Z1-Z2)-\beta*(Z3-Z4),$$

wherein β is an adjustable parameter.

Figure 8:
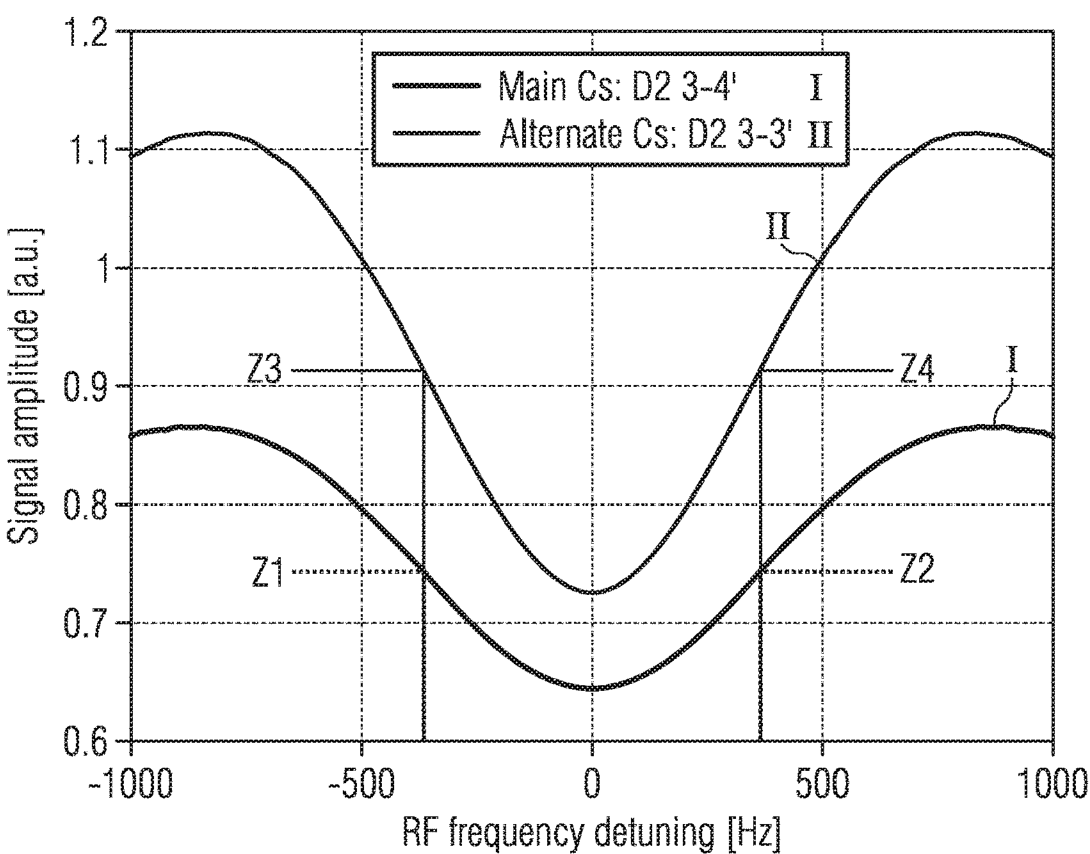
FIG. 8 shows a signal diagram for illustrating the operation of a possible embodiment of the method and apparatus according to the present invention.

From the wavelength modulation compensation error signal WM-CES, a feedback error signal FB-ES can be calculated by the calculation unit 4 in step SH. The feedback error signal FB-ES is calculated by multiplying the wavelength modulation compensation error signal WMC-ES with a loop filter constant kPID. The feedback error signal FB-ES can be converted by the digital to analogue converter 22 into a control voltage CRTL supplied to the tunable oscillator 23. Then, the process is reiterated as illustrated by the loop of FIG. 7. In the implemented algorithm, the laser frequency is either locked to the main optical pumping transition OPT1 (for cesium: D2 3-4') or to the alternate optical pumping transition OPT2 (for cesium: D2 3-3') where the RF signal fed in the Ramsey cavity 5 is swept. Then, the fringes are used to control the RF center frequency as illustrated in the diagram of FIG. 8. The amplitude of the Ramsey fringes depends on the used optical transition. As can be seen in FIG. 8, for two optical pumping transitions OPT1, OPT2, the amplitudes of the Ramsey fringes differ roughly by a factor 2. As the linewidth of the two Ramsey fringes are almost similar, the RF frequency discrimination slopes differ consequently by a factor 2 (derivative of the Ramsey fringes at resonance frequency).

As can be seen in FIG. 8, the same atomic beam flux using different optical pumping hyperfine transitions OPT1, OPT2 provides roughly a twice larger amplitude signal for the same linewidth and consequently a twice larger RF frequency discrimination slope. Curve I in FIG. 8 illustrates a signal amplitude on the main optical transition frequency OPT1. Curve II in FIG. 8 illustrates the signal amplitudes for the alternate optical transition frequency OPT2.

Figure 9:
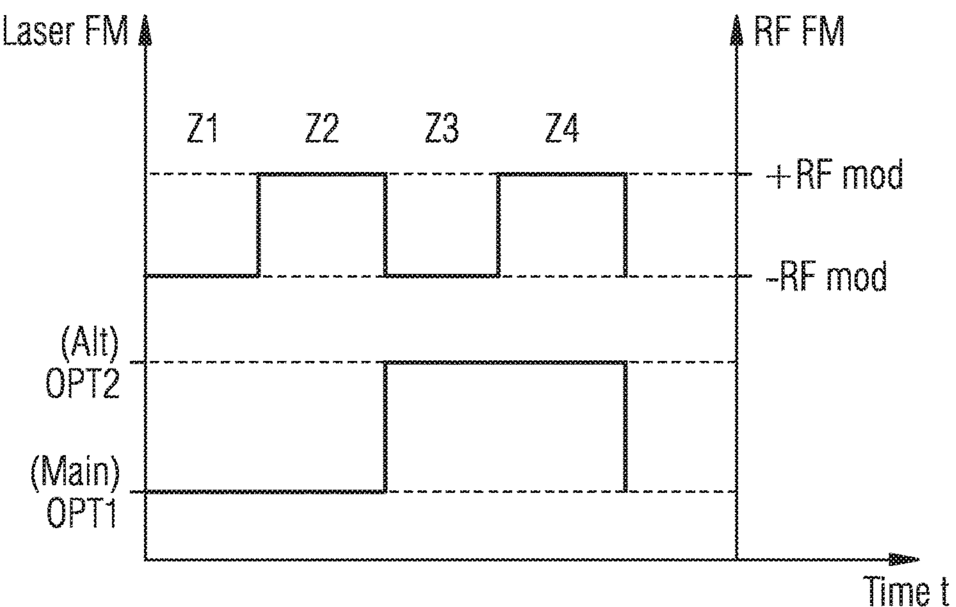
FIG. 9 shows a signal diagram for illustrating a possible implementation of a method and apparatus according to the present invention.

FIG. 9 illustrates a time sequence of the implemented algorithm as shown in the flowchart of FIG. 7. As can be seen in FIG. 9, the first and second signal amplitudes Z1, Z2 are measured at the main optical pumping transition OPT1. The third and fourth signal amplitudes Z3, Z4 are measured at the alternate optical pumping transition OPT2.

The first and third signal amplitude Z1, Z3 are both measured at the negative frequency modulation depth −FMD, while the second and fourth signal amplitude Z2, Z4 are measured at the positive frequency modulation depth +FMD.

With the method according to the present invention, instead of modulating laser power, the laser wavelength or optical frequency is modulated by the modulation unit 2 to provide a corresponding wavelength modulation compensation error signal WM-CES. This is made possible thanks to different available cesium atom optical transitions providing different photo and fluorescence yields. As can be seen in FIG. 8, for a given atomic beam flux, the Ramsey fringes slopes are roughly different by a factor 2 when using both the optical pumping transitions OPT1, OPT2. By toggling the laser wavelength between those two atomic transitions, steeper slopes can be achieved to provide an optimum point to compensate for the light shift. With the method according to the present invention, a laser wavelength is modulated in addition to the RF signal modulation. For that purpose, the laser frequency lock loop can be opened and the laser injection current can be shifted to move between the optical pumping transitions OPT1, OPT2.

The implementation of the method according to the present invention does not require additional hardware components for the optical setup but only an updated digital timing sequencer to toggle between the laser wavelengths.

Figure 10:
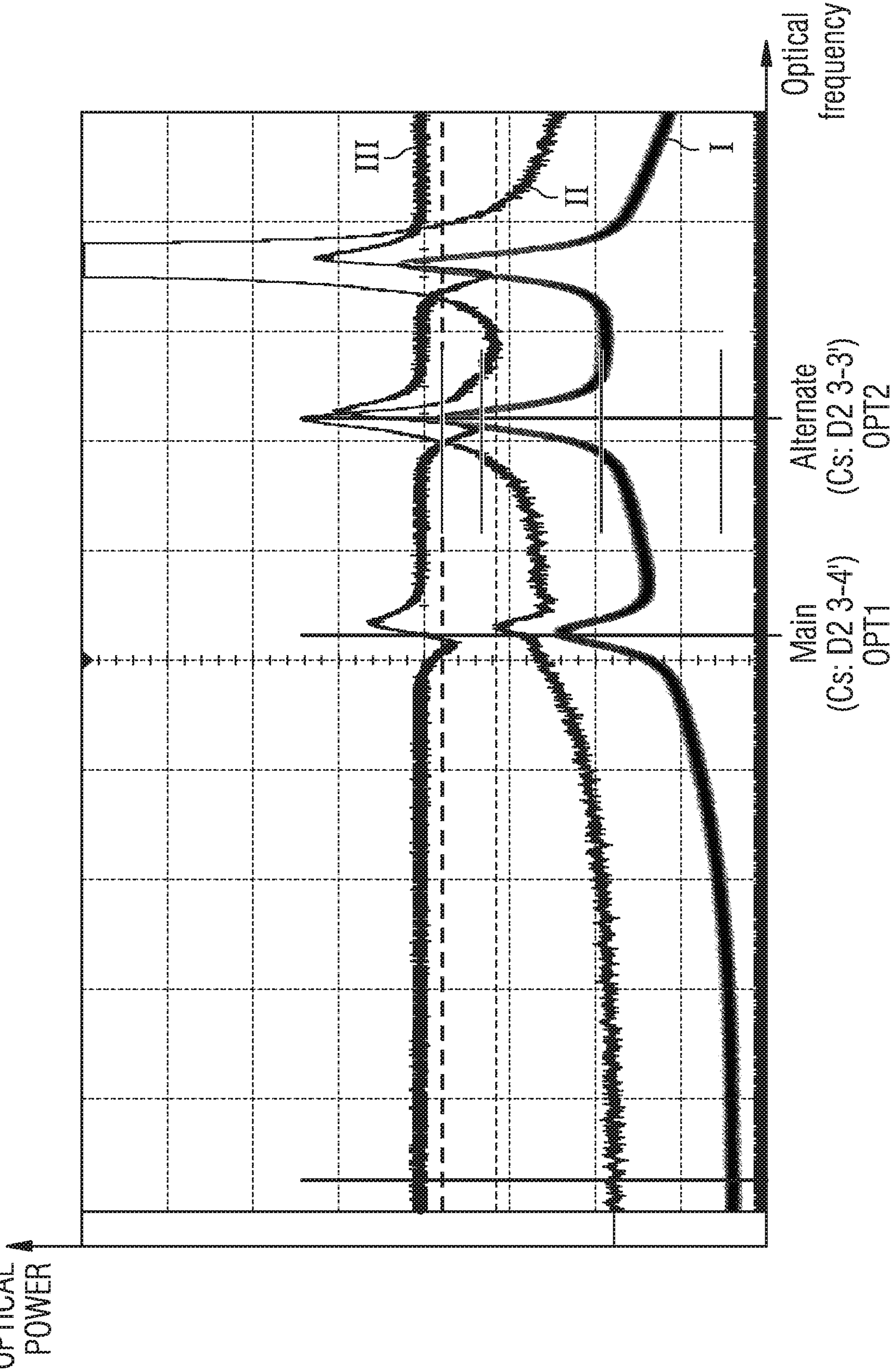
FIG. 10 shows an atomic spectroscopy measurement for illustrating the operation of the method and apparatus according to the present invention.

FIG. 10 illustrates an atomic spectroscopy measurement of an optical power as a function of the laser injection current supplied to the laser light source 10. The traces 1, 11 are measurements performed by means of the photodetectors 15, 16. A third trace III is the demodulated trace signal 1. Signals generated by the photodetectors 15, 16 are both composed of three contributions, i.e. background, atomic vapor and atomic beam. Two optical frequencies of interest can be defined, i.e. the main optical transition OPT1 and the alternate optical transition OPT2. The main and alternate optical transitions OPT1, OPT2 can be used to implement the method according to the present invention.

Figure 11:
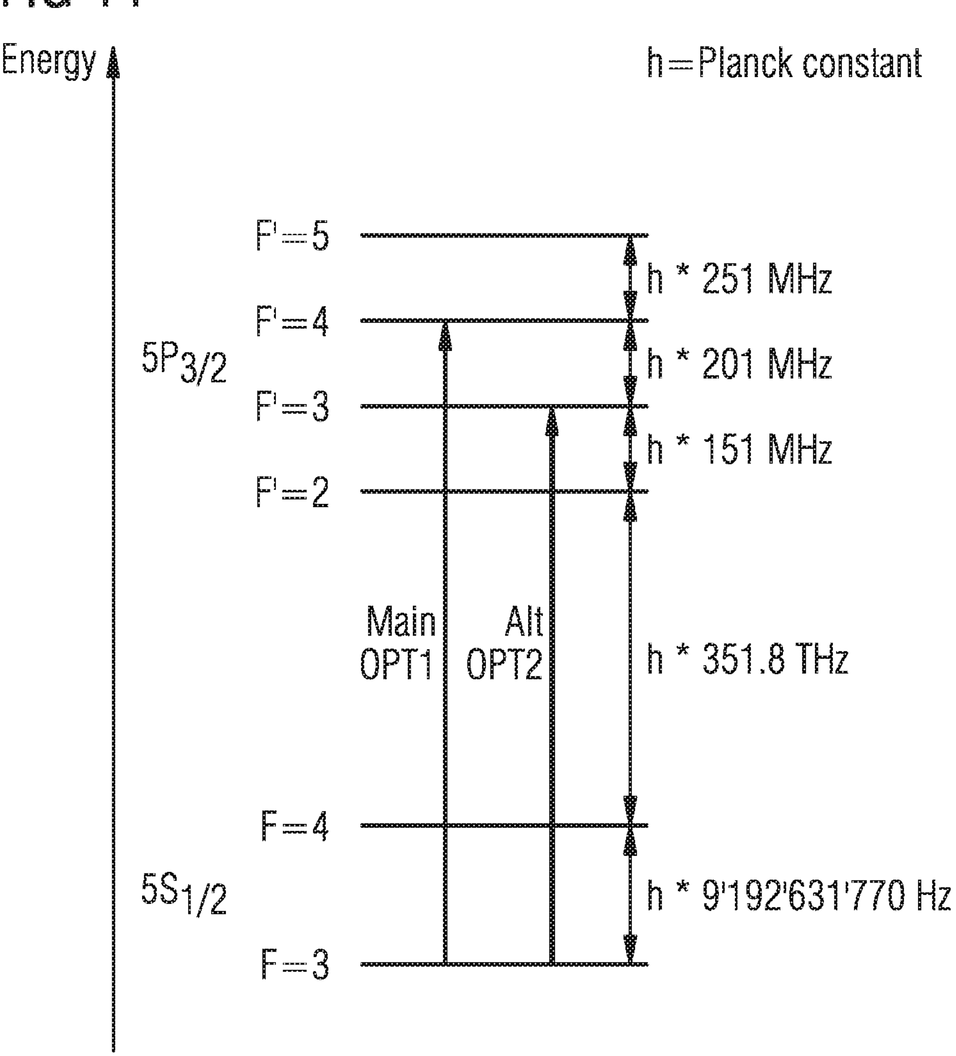
FIG. 11 shows a diagram for illustrating the involved energy levels of the $^{133}$Cs atom for the operation of the method and apparatus according to the present invention.

FIG. 11 further illustrates schematically the energy levels for cesium atoms to show the main optical transition OPT1 and the alternate optical transition OPT2 which can be used for implementing the method and apparatus 1 according to the present invention. The wavelength of the provided laser light can be toggled between the main optical pumping transition OPT1 and the alternate optical pumping transition OPT2 while the frequency of the microwave probe signal fed into the microwave cavity 5 is modulated with a frequency modulation depth FMD. The method and apparatus 1 according to the present invention has the advantage that it does not imply any impact on the hardware setup, i.e. neither for the Cs vacuum tube 8 nor for the optics or the electronics of the apparatus 1. The implemented method only requires updates of the timer sequencer in the FPGA and of the main clock frequency regulation loop. The method and apparatus 1 according to the present invention improve significantly the clock long-term frequency stability and its thermal sensitivity. The method according to the present invention provides a complete atomic light shift compensation.

The efficiency of the applied WM-CES algorithm to fully compensate the clock light shift depends on the accuracy of the tunable parameter $\mu$. The parameter $\beta$ depends in particular on the laser beams alignment by the beam splitter 11 and the mirror 12. For a given alignment, the optimal $\beta$ value can be determined by placing the whole system in a thermal chamber and applying a controlled temperature profile. The optimal value of the parameter $\beta$ is the one that minimizes the clock output frequency (10 MHz) variation (also called the thermal sensitivity of the clock output frequency). For a $\beta$ value smaller than the optimal $\beta$ value, a residual output frequency profile coherent with the applied external temperature profile is visible e.g in phase alignment (increase of the clock frequency with an increase of the outside temperature). For a $\beta$ value larger than the optimal $\beta$ value, a residual output frequency profile also coherent with the applied external temperature profile is visible, but e.g. with a 180° phase offset (increase of the clock frequency with a decrease of the outside temperature).

With the method according to the present invention, the thermal sensitivity is reduced. The method improves the long-term frequency stability and accuracy. The method according to the present invention can be used in high-precision spectroscopy measurements where optical power modulation is hardly possible. The method and apparatus 1 according to the present invention can be implemented in an atomic beam clock device. The method and apparatus 1 according to the present invention can be implemented in any other atomic or molecular clock using light. The method can also be applied in quantum computing and in quantum cryptography where also atom light interactions are used.

The invention claimed is:

1. A method for compensating a reference frequency shift due to an interaction of resonant light provided by a resonant light source with atoms of an atomic beam crossing a resonant microwave cavity between light interaction zones comprising the steps of:

toggling a wavelength of the provided resonant light between a main optical pumping transition, OPT1, and an alternate optical pumping transition, OPT2, of the atoms of the atomic beam while a frequency of the microwave probe signal fed into the microwave cavity is modulated with a frequency modulation depth, FMD, computing a wavelength modulation compensation error signal, WM-CES depending on the measured signal amplitudes of Ramsey fringes used to control the frequency of the microwave probe signal fed into the microwave cavity.

2. The method for compensating a reference frequency shift according to claim 1, wherein the atomic beam is a cesium beam comprising cesium atoms emitted by a cesium oven.

3. The method for compensating a reference frequency shift according to claim 2, wherein the emitted atomic beam propagates in high vacuum through a first light interaction zone where the atomic beam crosses perpendicularly laser light provided by the laser light source to change an energy state of the atoms of the atomic beam from a ground energy state to an excited energy state by optical pumping using available optical pumping transitions, OPT, of the atoms providing different fluorescence yields.

4. The method for compensating a reference frequency shift according to claim 1 wherein the resonant light comprises laser light provided by a laser light source.

5. The method for compensating a reference frequency shift according to claim 4, wherein a laser frequency of the laser light provided by the laser light source is locked to the main optical pumping transition, OPT1, or is locked to the alternate optical pumping transition, OPT2, of the atoms of the atomic beam while a microwave probe signal fed into the microwave cavity is swept to produce Ramsey fringes.

6. The method for compensating a reference frequency shift according to claim 5, wherein the laser frequency of the laser light is toggled between the main optical pumping transition, OPT1, and the alternate optical pumping transition, OPT2, by controlling a laser injection current supplied to the laser light source.

7. The method for compensating a reference frequency shift according to claim 1, wherein a first signal amplitude is measured at the negative frequency modulation depth, −FMD, on the main optical pumping transition, OPT1;

a second signal amplitude is measured at the positive frequency modulation depth, +FMD, on the main optical pumping transition, OPT1;

a third signal amplitude is measured at the negative frequency modulation depth, −FMD, on the alternate optical pumping transition, OPT2, and a fourth signal amplitude is measured at the positive frequency modulation depth, +FMD, on the alternate optical transition, OPT2.

8. The method for compensating a reference frequency shift according to claim 7, wherein the wavelength modulation compensation error signal, WM-CES, is calculated depending on the measured signal amplitudes of the produced Ramsey fringes according to the following equation:

$$WM\text{-}CES=(Z1-Z2)-\beta*(Z3-Z4),$$

wherein β is an adjustable parameter and wherein

Z1 is the first signal amplitude measured at the negative frequency modulation depth, −FMD, on the main optical pumping transition, OPT1;

Z2 is the second signal amplitude measured at the positive frequency modulation depth, +FMD, on the main optical pumping transition, OPT1;

Z3 is the third signal amplitude measured at the negative frequency modulation depth, −FMD, on the alternate optical pumping transition, OPT2; and Z4 is the fourth signal amplitude measured at the positive frequency modulation depth, +FMD, on the alternate optical pumping transition, OPT2.

9. The method for compensating a reference frequency shift according to claim 8, wherein a feedback error signal, FB-ES, is calculated by multiplying the wavelength modulation compensation error signal, WMC-ES, with a loop filter constant, kPID.

10. The method for compensating a reference frequency shift according to claim 9, wherein the feedback error signal, FB-ES, is converted by a digital to analogue converter, DAC, into a control voltage, CRTL, supplied to a tunable oscillator.

11. The method for compensating a reference frequency shift according to claim 1, wherein the atomic beam comprising atoms in one of two ground states propagates in high vacuum from the first light interaction zone through the resonant microwave cavity to a second light interaction zone.

12. The method for compensating a reference frequency shift according to claim 11, wherein the microwave cavity applies in response to a microwave signal an alternating magnetic field to the atoms of the atomic beam propagating through the microwave cavity to provide microwave energy which due to a resonance phenomenon changes the energy state of the atoms of the atomic beam propagating through the microwave cavity from one ground state to the other ground state.

13. The method for compensating a reference frequency shift according to claim 12, wherein the atoms of the atomic beam received from the microwave cavity comprising the changed ground state propagate in high vacuum through a second light interaction zone where the atomic beam crosses perpendicularly laser light provided by the laser light source to change an energy state of the atoms of the atomic beam from the ground energy state to an excited energy state by optical pumping using available optical pumping transitions, OPT, of the atoms providing different fluorescence yields.

14. The method for compensating a reference frequency shift according to claim 13, wherein fluorescence light emitted by the atoms of the atomic beam in the second light interaction zone are collected by a photodetector to generate a measurement signal having signal amplitudes of produced Ramsey fringes proportional to the quantity of the fluorescent light.

15. The method for compensating a reference frequency shift according to claim 14, wherein the control voltage, CRTL, output by the digital to analogue converter, DAC, is supplied to the tunable oscillator to tune a frequency of the microwave signal generating the alternating magnetic field within the microwave cavity.

16. An apparatus for compensating a reference frequency shift due to an interaction of laser light provided by a resonant light source with atoms of an atomic beam crossing a resonant microwave cavity between light interaction zones, said apparatus comprising:

a modulation unit adapted to toggle a wavelength of the provided light between a main optical pumping transition, OPT1, and an alternate optical pumping transition, OPT2, of the atoms of the atomic beam while a frequency of the microwave probe signal fed into the microwave cavity is modulated with a frequency modulation depth, FMD;

a measurement unit adapted to measure signal amplitudes of produced Ramsey fringes; and a calculation unit adapted to compute a wavelength modulation compensation error signal, WM-CES, depending on the measured signal amplitudes of the produced Ramsey fringes used to control the frequency of the microwave probe signal fed into the microwave cavity of the apparatus.

17. An atomic clock device comprising an apparatus for compensating a reference frequency shift due to an interaction of light provided by a resonant light source with atoms of an atomic beam crossing a resonant microwave cavity between light interaction zones, said apparatus comprising:

a modulation unit adapted to toggle a wavelength of the provided light between a main optical pumping transition, OPT1, and an alternate optical pumping transition, OPT2, of the atoms of the atomic beam while a frequency of the microwave probe signal fed into the microwave cavity is modulated with a frequency modulation depth, FMD;

a measurement unit adapted to measure signal amplitudes of produced Ramsey fringes; and a calculation unit adapted to compute a wavelength modulation compensation error signal, WM-CES, depending on the measured signal amplitudes of the produced Ramsey fringes used to control the frequency of the microwave probe signal fed into the microwave cavity of the apparatus.

* * * * *